United States Patent
Price et al.

(10) Patent No.: US 9,494,739 B2
(45) Date of Patent: Nov. 15, 2016

(54) CLADDING MODE SPATIAL FILTER

(75) Inventors: R. Kirk Price, Battle Ground, WA (US); Scott Karlsen, Battle Ground, WA (US); Rob Martinsen, West Linn, OR (US); Ronii C. Mehl, Caldwell, ID (US)

(73) Assignee: nLIGHT, Inc., Vancouver, WA (US)

( * ) Notice: Subject to any disclaimer, the term of this patent is extended or adjusted under 35 U.S.C. 154(b) by 1182 days.

(21) Appl. No.: 13/339,045

(22) Filed: Dec. 28, 2011

(65) Prior Publication Data

US 2012/0262938 A1 Oct. 18, 2012

Related U.S. Application Data

(60) Provisional application No. 61/476,126, filed on Apr. 15, 2011.

(51) Int. Cl.
*G02B 6/36* (2006.01)
*G02B 6/26* (2006.01)
*H01S 5/00* (2006.01)

(52) U.S. Cl.
CPC .............. *G02B 6/262* (2013.01); *H01S 5/005* (2013.01)

(58) Field of Classification Search
USPC ...................................................... 385/78, 81
See application file for complete search history.

(56) References Cited

U.S. PATENT DOCUMENTS

| | | | |
|---|---|---|---|
| 4,162,821 A * | 7/1979 | Schumacher | G02B 6/3861 385/59 |
| 4,303,304 A * | 12/1981 | Ruiz | G02B 6/3834 264/1.28 |
| 4,920,366 A * | 4/1990 | Bowen | G02B 6/3855 385/55 |
| 5,253,312 A | 10/1993 | Payne et al. | |
| 5,812,723 A | 9/1998 | Ohtsu et al. | |
| 5,857,053 A | 1/1999 | Kane | |
| 5,966,485 A | 10/1999 | Luther et al. | |
| 6,282,349 B1 | 8/2001 | Griffen | |
| 7,204,645 B2 | 4/2007 | Brown | |
| 7,280,733 B2 | 10/2007 | Larson et al. | |
| 7,435,012 B1 * | 10/2008 | Beldycki | 385/78 |
| 7,488,116 B2 | 2/2009 | Steve | |
| 7,540,668 B2 | 6/2009 | Brown | |

(Continued)

OTHER PUBLICATIONS

Office Action from the United States Patent & Trademark Office in co-pending U.S. Appl. No. 13/680,836, 9 pages, dated Jun. 20, 2014.

(Continued)

*Primary Examiner* — Eric Wong
(74) *Attorney, Agent, or Firm* — Klarquist Sparkman, LLP

(57) ABSTRACT

A laser system can include an optical fiber having a spatial filter defined as a core extension coupled to or integrally formed in an optical fiber so as to reduce the coupling of optical radiation into a fiber cladding. Such a core extension can be formed by removing a length of the cladding from the optical fiber, leaving a portion of the core exposed at the end of the fiber. Alternatively, a core extension can be formed by coupling an end cap to the core of the optical fiber at a fiber end surface. By selecting a length of the core extension based on a beam divergence and beam diameter, radiation coupling into the fiber core can be reduced.

24 Claims, 7 Drawing Sheets

(56) References Cited

U.S. PATENT DOCUMENTS

| | | |
|---|---|---|
| 8,057,106 B1 * | 11/2011 | Zhovnirovsky ........ G02B 6/322 |
| | | 385/139 |
| 8,721,631 B2 * | 5/2014 | Neuberger ...................... 606/15 |
| 2006/0171631 A1 | 8/2006 | Scerbak et al. |
| 2007/0172174 A1 | 7/2007 | Scerbak et al. |
| 2008/0165418 A1 | 7/2008 | Scerbak et al. |
| 2013/0011102 A1 | 1/2013 | Rinzler et al. |

OTHER PUBLICATIONS

Final Office Action from the United States Patent & Trademark Office in co-pending U.S. Appl. No. 13/680,836, 10 pages, dated Dec. 5, 2014.

Notice of Allowance from the U.S. Patent and Trademark Office in co-pending U.S. Appl. No. 13/680,836, dated Jul. 23, 2015, 13 pages.

* cited by examiner

CLADDING MODE SPATIAL FILTER

CROSS REFERENCE TO RELATED APPLICATIONS

This application claims the benefit of U.S. Provisional Application 61/476,126, filed Apr. 15, 2011, which is incorporated herein by reference.

FIELD

The disclosure relates to a spatial filter for power coupling to optical fibers.

BACKGROUND

Optical fibers are commonly used for delivery of optical beams produced by laser sources such as laser diodes to a work surface or other target. Optical fibers offer many advantages over conventional optical systems used for beam delivery as optical fiber based systems tend to be small, inexpensive, and permit convenient beam delivery even to difficult locations. Optical fibers of many sizes and designs are commercially available.

Conventional optical fibers are typically cylindrical dielectric waveguides that transmit optical flux (e.g., light) along an axis using total internal reflection. Optical fibers typically consist of a core surrounded by a cladding layer, both of which are made of dielectric materials. The core is provided for optical flux propagation, while the cladding serves to confine the optical flux within the core. Further, the cladding can be surrounded by a buffer layer or coating (e.g., a polymeric coating) that can provide mechanical protection to the components of the optical fiber. To confine the optical beam in the core, the refractive index of the core is greater than that of the cladding. Confinement can be provided by an abrupt refractive index change at the core/cladding boundary (a step-index fiber) or a gradual variation in core refractive index (a graded-index fiber).

In coupling fibers to light sources, the fiber typically is cleaved or polished such that the ends of the core and cladding are substantially co-planar. An optical flux (e.g., a beam from a laser diode) is focused into the fiber at the planar end surface.

In order for the optical flux to propagate in the fiber, the optical flux must enter the fiber at an angle within the fiber numerical aperture. Optical flux that enters the fiber within the numerical aperture is confined in the core by the core/cladding boundary while optical flux at greater angles tends to enter the fiber cladding, producing a cladding mode flux. Light that misses the fiber core can also be coupled into the cladding. Many practical applications require a laser flux to be confined strictly to the core of the fiber. Optical flux not confined to the core can produce a halo effect at the end of the fiber and can result in substantial power loss and/or damage, especially in irradiation systems based on high power laser diodes. Optical flux coupled to the cladding must generally be removed, such as by using a mode stripper. However, use of a mode stripper can be an undesirable complication. Thus, there is a need for improved methods and apparatus for coupling optical power into optical fibers.

SUMMARY

Disclosed embodiments of optical fibers can comprise a spatial filter that can substantially eliminate optical flux coupled to the cladding due to the optical spot size being larger than the size of the core of the fiber and/or due to misalignment of the fiber. In one embodiment, a portion of a fiber cladding layer can be physically removed from the core of the fiber (e.g., by etching) at a proximal end of the fiber to form an exposed section of the core. Optical flux coupled to the exposed core can then be transmitted through the fiber towards a distal portion of the fiber comprising a core, cladding, and buffer. Optical flux that is external to the exposed fiber core expands after propagating past the beam waist, thus reducing efficiency of coupling optical flux into the cladding.

In some examples, optical illumination apparatus include an optical radiation source configured to produce an optical beam having at least one of a beam diameter $D_{beam}$ or numerical aperture $NA_{beam}$ configured for coupling to an optical fiber. A section of optical fiber is provided that includes a core and a cladding that extend to a first fiber end, wherein the optical fiber has a core diameter $D_{core}$, a cladding diameter $D_{clad}$, and a numerical aperture NA. A core extension is optically coupled to the core at the first fiber end and extends from the first fiber end a distance of at least $D_{clad}/2NA_{fiber}$ or at least $D_{clad}/NA_{beam}$, wherein an input surface of the core extension is situated so as to receive the optical beam. In some embodiments, the core extension comprises a cladding-stripped region at the first fiber end, wherein substantially all of the cladding is removed from the cladding-stripped region. In further examples, the cladding tapers so as to define the core extension. In other alternatives, a cladding terminal surface at the core extension is substantially perpendicular to a longitudinal axis of the optical fiber. In still other representative examples, a cladding terminal surface at the core extension is tilted at an angle of between about 45 degrees and 90 degrees with respect to a longitudinal axis of the optical fiber. In some examples, the core extension comprises a reduced-cladding region at the first fiber end, wherein a portion of the cladding is removed along the reduced-cladding region, and a reduced cladding thickness is less than about ⅒ or 1⁄20 of a cladding diameter $D_{clad}$. In other representative examples, the core extension comprises an end cap secured to at least the core of the optical fiber, and the diameter of the end cap is substantially equal to the diameter of the core of the optical fiber at the first fiber end.

In other embodiments, the optical fiber is a single mode optical fiber for a wavelength λ, and the core extension extends from the first fiber end a distance of at least $D_{core}D_{clad}/\lambda$, or the core extension extends from the first fiber end a distance of at least 2, 5, 10, or 50 times $D_{core}D_{clad}/\lambda$. In some examples, the optical fiber is a multimode optical fiber, and the core extension extends from the first fiber end a distance of at least 2, 5, or 10 times $(D_{clad}-D_{core})/2NA_{fiber}$, or a distance of at least 2, 5, or 10 times $D_{clad}/2NA_{fiber}$. Typically, the core diameter is between about 8 and 500 μm, and the cladding diameter is between about 50 μm and 2 mm.

Systems for delivering optical radiation to a target include an optical radiation source and a beam shaping optical system configured to produce an optical beam having a beam diameter and a beam numerical aperture. A core-extended optical fiber is situated to receive the optical beam at a core extension, wherein a length of the core extension is greater than a distance corresponding to a ratio of a cladding diameter of the core-extended optical fiber to the beam numerical aperture or a ratio of a cladding diameter of the core-extended optical fiber to a fiber numerical aperture. In other alternatives, the optical radiation source includes at least one laser diode array, and the beam shaping optical system is configured to produce a combined optical beam. In typical examples, the length of the core-extended optical fiber is greater than 2, 5, 10, or 20 times the distance corresponding to a ratio of a cladding diameter of the core-extended optical fiber to the beam numerical aperture or a ratio of a cladding diameter of the core-extended optical fiber to a fiber numerical aperture. In some embodiments, the core extension comprises a cladding-thinned portion of the optical fiber or a cladding stripped portion of the optical fiber.

Methods include providing an optical beam having a beam numerical aperture and a beam diameter and directing the optical beam to an input surface of a core-extension on an optical fiber so as to couple the optical beam into a fiber core and so that the optical beam at an exit surface of the core-extension has a diameter that is greater than a fiber cladding diameter. The optical beam is directed to a target using the optical fiber. In some examples, the optical beam has a beam numerical aperture and a beam diameter corresponding to at least one of a core diameter and a numerical aperture of the optical fiber. In representative examples, a length of the core extension is greater than a distance corresponding to a ratio of a cladding diameter of the core-extended optical fiber to the beam numerical aperture or a ratio of a cladding diameter of the core-extended optical fiber to twice a fiber numerical aperture. In some embodiments, a diameter of an end cap or other core extension can be substantially equal to the diameter of the fiber core.

The foregoing and other features of the disclosed technology will become more apparent from the following detailed description, which proceeds with reference to the accompanying figures.

DETAILED DESCRIPTION

Figure 1:
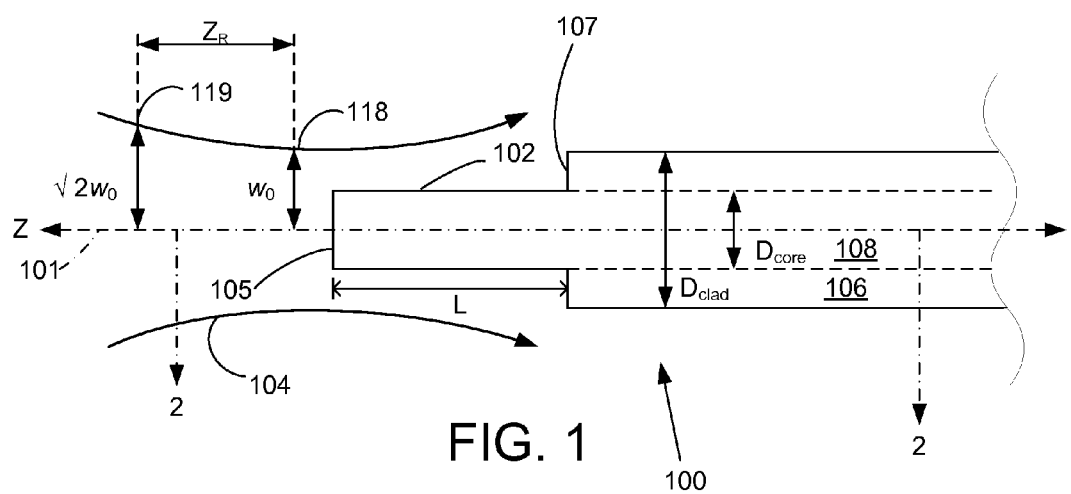
FIG. 1 is a schematic elevational view of an optical beam incident to an optical fiber have a core extension.

The following description is exemplary in nature and is not intended to limit the scope, applicability, or configuration of the disclosed embodiments in any way. Various changes to the described embodiment may be made in the function and arrangement of the elements described herein without departing from the scope of the disclosure.

As used in this application and in the claims, the singular forms "a," "an," and "the" include the plural forms unless the context clearly dictates otherwise. Additionally, the term "includes" means "comprises."

Although the operations of exemplary embodiments of the disclosed methods may be described in a particular, sequential order for convenient presentation, it should be understood that disclosed embodiments can encompass an order of operations other than the particular, sequential order disclosed. For example, operations described sequentially may in some cases be rearranged or performed concurrently. Further, descriptions and disclosures provided in association with one particular embodiment are not limited to that embodiment, and may be applied to any embodiment disclosed.

Moreover, for the sake of simplicity, the attached figures may not show the various ways (readily discernable, based on this disclosure, by one of ordinary skill in the art) in which the disclosed systems, methods, and apparatus can be used in combination with other systems, methods, and apparatus. Additionally, the description sometimes uses terms such as "produce" or "provide" to describe the disclosed methods. These terms are high-level abstractions of the actual operations that can be performed. The actual operations that correspond to these teens can vary depending on the particular implementation and are, based on this disclosure, readily discernible by one of ordinary skill in the art. Figures are not drawn to scale.

As used herein, an optical flux refers to propagating optical radiation in a wavelength range of between about 100 nm and about 5000 nm, typically between about 200 nm and about 2000 nm, 400 nm and 1800 nm, or 600 nm and 1600 nm. In many examples, such optical fluxes can be propagated in solid optical waveguides such as optical fibers that are silica-based. However, in other examples, longer or shorter wavelengths can be used, and waveguides such as fibers can be made of other materials as appropriate. Suitable optical fibers can comprise, for example, glass, polymers, semiconductors, and combinations thereof. For example, optical fiber cores can comprise glass or plastic. In some embodiments, an optical fiber core can comprise quartz ($SiO_2$) doped with germanium dioxide ($GeO_2$), silica, fluorozirconate, fluoroaluminate, fluoride glass, phosphate glass, and/or chalcogenide glasses. Optical fiber cladding can comprise, for example, quartz. Disclosed embodiments can also include coatings on the optical fiber, such as urethane acrylate on the outer surface of the optical fiber.

While single mode fibers are convenient in many applications, in some examples fibers that support a few modes are used and are referred to herein as "few mode" fibers. Such fibers have a normalized frequency parameter (V-number) defined as $V=(2\pi a/\lambda)(n_{core}^2-n_{clad}^2)^{1/2}=2NA$, wherein $\lambda$, is vacuum wavelength, $\alpha$ is a fiber core radius, $n_{core}$, $n_{clad}$ are fiber core and fiber cladding refractive indices, respectively, and NA is numerical aperture. A total number M of modes supported by a fiber is about $M=4V^2/\pi^2$. For single mode fibers, V is less than about 2.405. As used herein, a few mode fiber is defined as a fiber for which a V-number is less than about 2.5, 3, 3.5, 4, 4.5, 5, or 10. In other examples, multimode fibers can be used.

In some examples, so-called double clad or double core fibers are used. Such fibers typically include a core, an inner cladding, and an outer cladding. The core is typically selected to define a single mode (or few mode) waveguide, while the inner cladding defines a multimode core. Generally, a refractive index difference between the inner cladding and the outer cladding is relatively large so that a numerical aperture of the multimode waveguide defined by the inner and outer claddings can be large.

While many useful fibers have circular cross-sectional areas, fibers having oval, elliptical, square, rectangular, polygonal, or other cross-sectional areas can be used. In most practical applications, fibers having low propagation losses are used for which an effective core refractive index is greater than an effective cladding refractive index. However, for short propagation distances or in applications in which loss can be tolerated, lossy fibers can be used in which an effective core refractive index is less than an effective cladding refractive index.

While embodiments of the disclosed technology are described with reference to specific optical fiber properties such as core diameter and numerical aperture, other types of optical fibers and optical waveguides can be used. For example, any shape and size (e.g., any geometry) of optical waveguide can be used. For example, waveguides can be strips, rods, or planar waveguides, or arrays of such waveguides. Waveguides can be cross-sectional areas of any suitable shape, such as substantially circular, elliptical, square, rectangular, octagonal, or oval. In examples using optical fiber waveguides, fiber core diameter ($D_{core}$) can be, for example, from about 1 μm to about 1 mm. Either single mode or multimode fibers can be used. In some embodiments, the core diameter can be from about 2 μm to about 500 μm. In other embodiments, the core diameter can be from about 3 μm to about 12 μm. In some embodiments, the core diameter can be from about 500 μm to about 1 mm. A fiber overall diameter ($D_{fiber}$) can be from about 1 μm to about 10 mm or larger. In typical examples, overall diameters are from about 75 μm to about 1 mm.

In convenient examples, an optical flux provided to a fiber or other waveguide can be produced by a laser or other source that can produce a spatially coherent flux, but light emitting diodes or other sources can be used, and input optical fluxes need not be spatially coherent. In some examples, optical beams or other optical fluxes and waveguides such as optical fibers are referred to as extending along an axis or along an optical axis. Such axes are not necessarily straight lines, but can be bent, folded, curved, or otherwise shaped by optical elements such as mirrors, lenses, or prisms, or due to the flexibility of the waveguide. While in some disclosed examples, axially symmetric beams are described in which beam divergence angle with respect to a propagation axis is constant, in other examples, beam divergence angle is a function of azimuthal angle about the propagation axis. In some examples, laser diode based optical beams can be characterized by two divergence angles, and expand differently with respect to a fast axis and a slow axis.

Optical propagation in optical fibers or other optical waveguides can be characterized based on a mode field diameter (or radius) and a mode numerical aperture or beam divergence. For a circularly symmetric, step index, single mode fiber, mode field diameter is approximately equal to core diameter. Such fibers can be characterized by mode field diameter and numerical aperture, which describe an optical flux emitted from such a fiber. Mode field diameter $2w$ and numerical aperture are related and numerical aperture is proportional to $\lambda/2w$. For a circularly symmetric, step index or gradient index multimode fiber, mode field diameter can be approximately as large as core diameter, depending on which of the fiber modes optical power is coupled into. With power coupled into substantially all available modes, optical radiation exits the fiber having a diameter approximately equal to the core diameter and having a numerical aperture (angular radius) that can be associated with a core/cladding refractive index difference. For convenience in the following description, an optical beam diameter exiting an optical fiber at a cleaved (planar) fiber exit surface is described as having a beam diameter equal to the fiber core diameter $D_{core}$ and a numerical aperture (or beam divergence) NA equal to the fiber numerical aperture.

In typical coupling of optical power from a beam into an optical fiber, an optical flux is directed towards the core and cladding of the optical fiber. If the optical flux is misaligned with respect to the fiber, or if the diameter of the optical flux is greater than the diameter of the core, then optical flux can enter the cladding. The disclosed embodiments include a core extension that serves as a spatial filter and can reduce the amount of optical flux coupled into a cladding, thereby at least partially reducing the related deleterious effects associated with cladding modes.

While examples are described with particular optical beams, any of the disclosed systems and apparatus can be used to couple an optical flux from a laser diode or other optical source (e.g., fiber lasers, gas lasers, light-emitting diodes, laser diode arrays) to form a laser irradiation system. For example one or more beams or a combined beam from a laser diode array can be coupled to an optical fiber via an exposed core section or an end cap fused to the optical fiber using one or more spherical lenses or cylindrical lenses. Irradiation systems based on the disclosed apparatus can be used for any suitable application. For example, high power laser diodes coupled to an optical fiber as described herein can be useful in metalworking and solar cell manufacturing.

While fiber ends are conveniently perpendicular to a fiber propagation axis and produced by cleaving a fiber, in some examples, fiber end surfaces are tilted or angled with respect to a propagation axis. Such tilted or angled ends (or perpendicular end surfaces) can be provided with reflective coatings.

Different portions of disclosed optical fibers can have different cross sectional sizes and/or shapes. For example, an optical fiber can have different portions having different diameters, with tapered portions connecting the areas of different diameters. Further, different portions of disclosed cores of optical fibers can have different cross sectional sizes and/or shapes in different areas of the optical fiber. While in many examples, a fiber core is centered in a fiber, the fiber core need not be centered with respect to the cladding. In some examples, fibers can be single mode, few mode, or multi-mode mode fibers and various refractive index distributions can be provided. For example, the fiber can have a gradient index or a step index. In some embodiments, a core extension can be provided on a gradient index fiber having a core with a refractive index that decreases with an increasing radial distance from the fiber axis.

Figure 2:
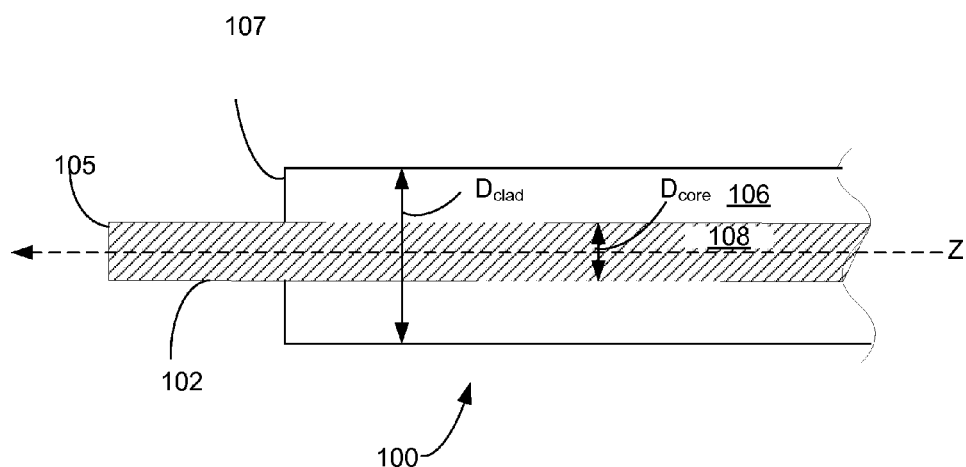
FIG. 2 is a cross sectional view of the optical fiber of FIG. 1, taken along line 2-2.

With reference to FIGS. 1-2, a laser beam 104 is incident to an optical fiber 100 along an axis 101. The laser beam 104 can be produced by one or more laser diodes, and the laser beam 104 can be directed along the axis 101 with a fiber coupler, one or more lenses, mirrors, or other optical elements. In the example, of FIGS. 1-2, the laser beam 104 is assumed to be axially symmetric and propagate in a lowest order Gaussian beam mode. In other examples, the laser beam 104 can be configured to propagate in one or more higher order modes, and need not be axially symmetric. Variation of a cross-sectional area of a lowest order Gaussian beam such the laser beam 104 can be described with reference to a so-called Rayleigh range $z_R$ that is defined as a distance from a beam waist location 118 at which the laser beam 104 has its smallest cross-sectional area to a location 119 at which the beam cross sectional area is double the cross sectional area at the beam waist location 118. As shown in FIG. 1, the laser beam 104 has a beam waist $w_0$ (or minimum spot size) at the beam waist location 118, and the beam spot size w(z) varies along the axis 101 such that the spot size w(z) increases on either side of a beam waist 118 as a function of the distance z from the beam waist location z, which, for convenience, can be defined as z=0. For a lowest order Gaussian beam, $w(z)=w_0 [1+(z/z_R)^2]^{1/2}$ and a far field angular divergence (angular radius or numerical aperture) is about $\lambda/\pi w_0$, wherein $\lambda$ is a beam wavelength.

The optical fiber 100 includes a core 108, a cladding 106, and a core extension 102 having a length L that extends outwardly from a terminal surface 107 of the cladding 106. The optical fiber 100 can also include additional layers surrounding the cladding 106, such as one or more buffer layers or other protective layers or coatings, but these are not shown in FIGS. 1-2. The core 108 has a core diameter $D_{core}$, and a refractive index difference between the core 108 and the cladding 106 typically defines a fiber numerical aperture NA. As shown in FIGS. 1-2, the core extension 102 comprises a cladding stripped region of the fiber 100, but in other examples, some portion of the cladding 106 can remain on the core extension 102. The cladding 106 can be removed from the core 108 by etching or other processes, thereby creating the core extension 102. Typically, the thickness of any remaining cladding portions on the core extension 102 is less than ⅓, ⅕, 1/10, 1/20, or 1/100 of the fiber cladding diameter. Although not shown in FIGS. 1-2, at least a portion of the optical fiber 100 can be secured in a ferrule, if desired, but it is generally preferable that the core extension 102 extend outwardly from the ferrule, if so configured, so that the reflections at ferrule surface do not tend to couple the received optical flux into the cladding 106.

The terminal surface 107 of the cladding 106 can be reflective and/or roughened in such a way so as to provide at least partial scattering of any optical flux from the laser beam 104 that is incident to the terminal surface 107 so as to reduce beam coupling into the cladding 106. Alternatively, the terminal surface 107 can be provided with a reflective coating such as a metallic or dielectric reflective coating so that any optical flux reaching the terminal surface 107 tends to be reflected so as to not be coupled into the cladding 106.

Characteristics of the optical fiber 100 can be used to determine an appropriate length L for the core extension 102. Typically, an input surface 105 of the core extension 102 is situated approximately at the beam waist location 118 (to within a Rayleigh range $z_R$) and the beam waist $w_0$ is selected so that a beam diameter is approximately the same as the core diameter $D_{core}$, i.e., $2w_0=D_{core}$. At the terminal surface 107 of the cladding layer 106, the beam diameter should be at least 1.5, 2, 5, 10, 20, 50, or 100 times the cladding diameter $D_{clad}$. For single mode fibers, the cladding diameter $D_{clad}$ is typically 10-20 times the core diameter, so that beam diameter at a distance z from the beam waist (and the input surface 105) is approximately $\beta z$, wherein $\beta$ is beam angular diameter. Thus, at a distance $z=D_{clad}/\beta$ the laser beam 104 has a diameter approximately equal to the cladding diameter. Because the far field angular diameter of a Gaussian beam is $2\lambda/\pi w_0$ or about $4\lambda/\pi D_{core}$ with a beam diameter matched to core diameter, a value of z for which the beam divergence results in a beam diameter approximately equal to the cladding diameter is $D_{core} D_{clad}/\lambda$. For convenience, a distance z at which a beam spreads so as to approximately match the cladding diameter can be referred to as a clad match distance $L_{match}$, or, for single mode fibers, a single mode clad match distance. In order to reduce beam coupling into the cladding 106, the length L of the core extension is then preferably 1.5, 2, 5, 10, 20, 50, 100, or more times the clad match distance $L_{match}$. By situating a core extension and a terminal surface of a fiber cladding in this manner, portions of an input laser beam that would tend to propagate in higher order modes in a fiber or in a fiber cladding tend to be inefficiently coupled to the fiber, so that a core extension serves as a spatial filter.

While the example of FIGS. 1-2 is described and illustrated above with reference to a single mode fiber 100 and a laser beam input propagating in a lowest order Gaussian beam mode, similar fiber/beam configurations can be used for multimode fibers and beams, and single mode configurations are not required. Typically, beam diameter at the cladding terminal surface should be selected to be at least about 1.5, 2, 4, 8, 10, 20 or more times the cladding diameter. For a multimode fiber having a core diameter $D_{core}$ and a numerical aperture NA, an arbitrary input optical flux (not limited to one or a few beam modes) is typically coupled to the multimode fiber as focused so as to substantially match the fiber core diameter and numerical aperture. An input beam diameter as a function of distance z from the fiber input 105 is approximately $D(z)=D_{core}+2NAz$, or $D_{core}+z\beta$, wherein $\beta=2NA$. Thus, at a distance $z=(D_{clad}-D_{core})/2NA$ from the input surface 105, an input beam matched to the core diameter and numerical aperture has a diameter that is approximately equal to the cladding diameter. As noted above, this distance can be referred to as a clad match distance $L_{match}=(D_{clad}-D_{core})/2NA$, and the core extension length L is preferably at least about 1.4, 2, 4, 8, 10, 20, or more times the clad match distance. In many examples, a clad match distance can be determined as $D_{clad}/2NA$.

Figure 3:
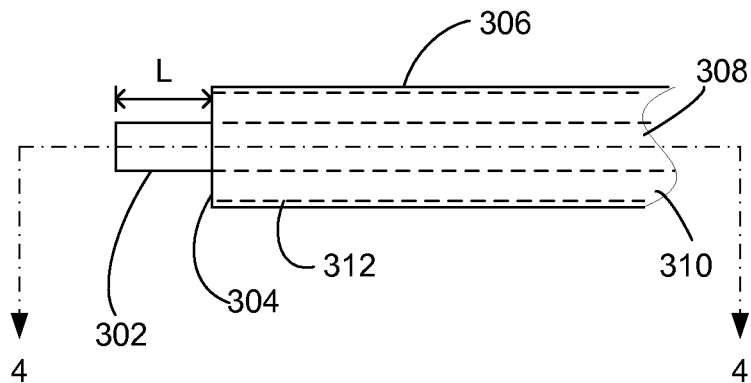
FIG. 3 is a schematic elevational view of an optical fiber having a core extension provided as an end cap.
Figure 4:
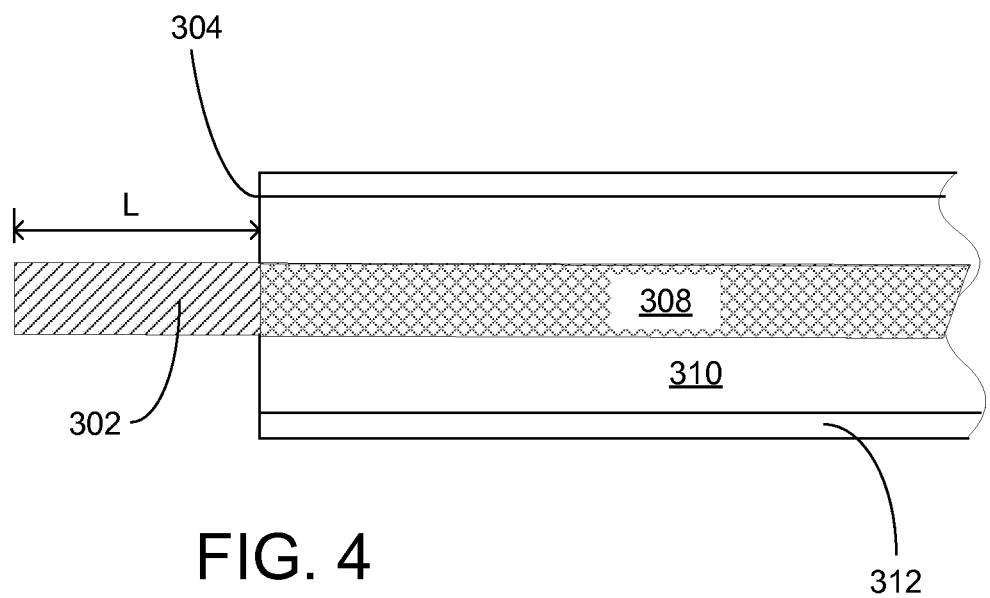
FIG. 4 is a cross sectional view of the optical fiber of FIG. 3, taken along line 4-4.

With reference to FIG. 3-4, a core extension 302 is optically coupled to an input surface 304 of an optical fiber 306. The fiber 306 can be a multimode or single mode fiber, and includes a core 308, a cladding 310, and a buffer 312. The core extension 302 comprises an optically transmissive rod that can be secured to the optical fiber 306 with an optical adhesive or by thermal splicing. The input surface 304 of the optical fiber 306 can be provided by cleaving. As shown, the cladding 310 and the buffer 312 extend to the input surface 304, but in some examples, one or both can terminate a distance from the input surface 304. As shown in FIG. 3, the optical fiber 306 has a constant circular cross-sectional area, but in other examples, a fiber having rectangular, elliptical, or other cross-sectional areas can be used, and cross-sectional area can vary corresponding to a constant or variable taper.

The core extension 302 can be coupled to the core 308 of the optical fiber 306 and be positioned in or near a focus of an optical flux to be coupled into the fiber 306. Typically, the core extension 302 has a diameter substantially equal to the diameter of the core 308, but in some examples the core extension 302 can have a diameter smaller or larger than the diameter of the core 308. Exposed portions of the input surface 304 (i.e., those portions that are not covered by the core extension 302) can be provided with a reflective coating such as a reflective metallic or dielectric coating, or can be provided with a roughened surface so as to at least partially reflect or scatter any optical flux incident to the exposed portion. In some examples, an exposed portion corresponding to the cladding 310 is provided with a dielectric reflective coating. A suitable length L for the core extension 302 can be determined as described above based on a clad match distance $L_{match}$. In some embodiments, the core extension 302 can be completely isolated, with no portion of the buffer 312 remaining on the core extension.

Figure 5:
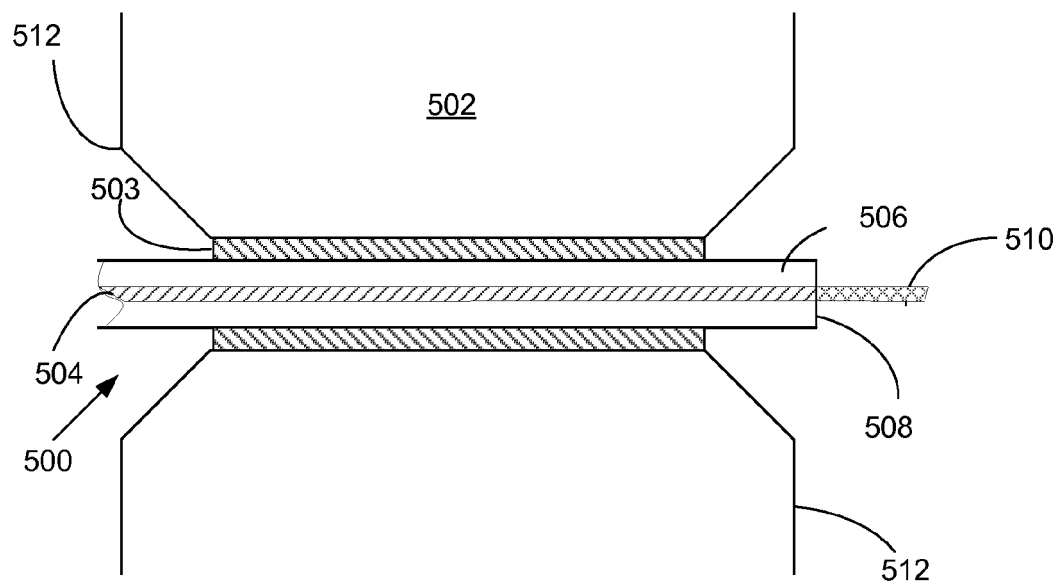
FIG. 5 is a sectional view of an optical fiber secured within a ferrule.

With reference to FIG. 5, an optical fiber 500 is secured in a ferrule 502 with an adhesive layer 503. In other examples, ferrule diameter and an outside diameter of the optical fiber 500 are closely matched, and the adhesive layer 503 is omitted. The optical fiber 500 and the ferrule 502 can be secured to each other one or more other locations as part of, for example, a connector assembly that includes the ferrule 502. The optical fiber 500 comprises a core 504 that is surrounded by a cladding 506, and extends in a longitudinal direction from a first end 508 to a second end. A core extension 510 is provided at the first end 508 of the optical fiber 500, and can be formed by fusing, gluing, or otherwise securing a transmissive end cap to the core 504 at the first end 508, or a portion of the core 504 can be stripped of cladding. As shown in FIG. 5, the optical fiber 500 can be positioned within the ferrule 502 so that the core extension 510 projects outwardly at the first end 508 and is not within the ferrule 502. Typically, the ferrule 502 includes terminal surfaces 512, and the first end 508 of the optical fiber 500 and/or the core extension 510 extend beyond the terminal surfaces 512.

Figure 6:
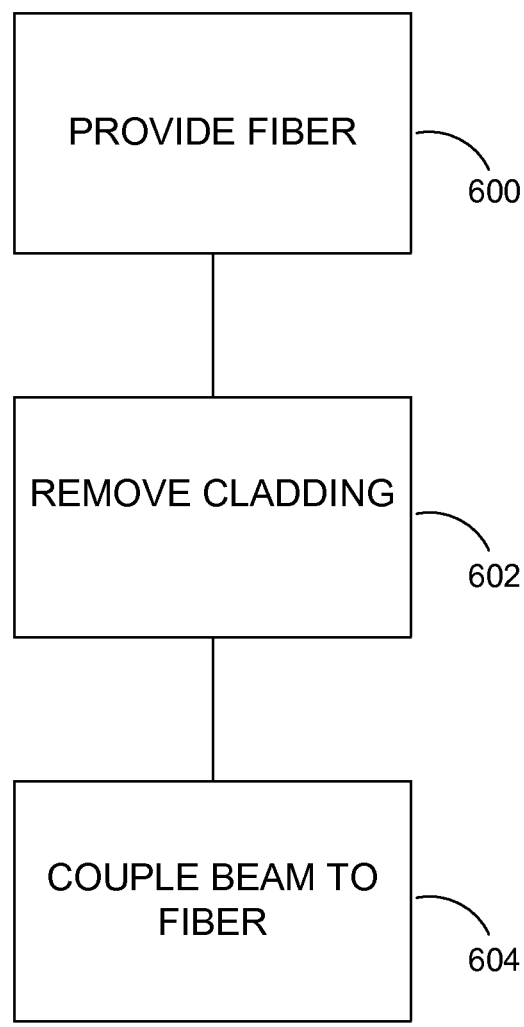
FIG. 6 is a block diagram of one method of making a laser system having a spatial filter provided as a core extension.

Methods of making and/or using an optical fiber having a core extension and methods of making and/or using laser systems including the same are also disclosed. FIG. 6 is a block diagram of one method of making a laser system having a core extension, thereby reducing the efficiency of coupling optical flux into the fiber cladding. At 600, an optical fiber having a core and a cladding surrounding at least a portion of the core is provided. The core and the cladding can extend in a longitudinal direction from a first end of the optical fiber to a second end of the optical fiber. The optical fiber can be provided with a core diameter $D_{core}$ and a numerical aperture NA. A core extension can be provided at fiber end at 602 by, for example, removing or partially removing the cladding from at least a portion of the optical fiber at the fiber end. In some embodiments, a separate transmissive core extension can be optically coupled to the fiber core but substantially optically uncoupled to the cladding. Typically the cladding is thinned and/or substantially removed from one or more portions of the core adjacent a fiber end so that the cladding terminates at a terminal surface that is perpendicular to a longitudinal axis of the optical fiber, but in other examples, the terminal surface is tilted with respect to the longitudinal axis. In other examples, the terminal surface is roughened and or provided with a reflective coating.

A length of cladding that is substantially greater than a clad match distance is removed, typically a length that is 2, 4, 18, 10, 20 or more times the clad match distance. A portion of the cladding can be removed using any suitable technique. In one embodiment, the optical fiber can be scored and cleaved. Then, a portion of the cladding can be etched back or otherwise removed (e.g., by mechanical stripping). For example, the cladding can be etched away in a buffered hydrogen fluoride solution. The etching or other removal of the cladding can terminate at a cladding interface surface, and such surface can be reflective and/or roughened so as to at least partially scatter any optical flux incident to the interface surface. In examples in which the core extension retains a thinned cladding layer, a clad match distance can be based on a diameter or other dimension of the thinned cladding.

The optical fiber can be coupled to an optical flux source such as a laser diode, an array of single emitter laser diodes, laser diode array, a solid state laser, and/or a light-emitting diode at 604. Any suitable methods and couplings can be used to couple the disclosed optical fibers having a spatial filter to an optical flux source. Generally, an input beam is shaped for coupling in one or more of diameter or numerical aperture using suitable combinations of optical elements.

Figure 7:
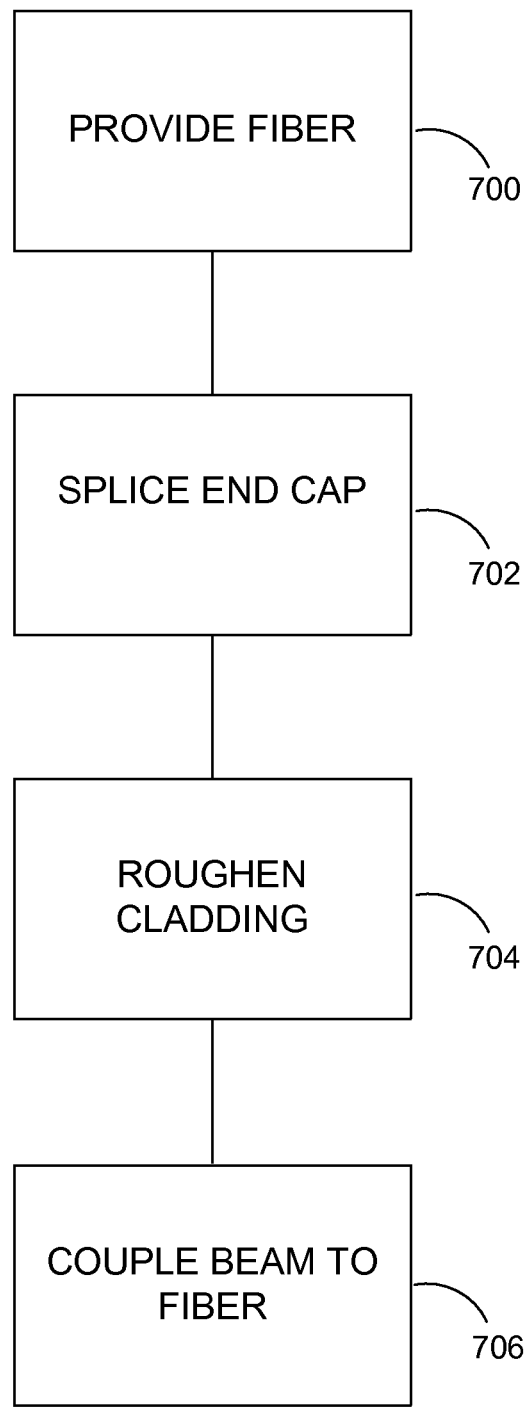
FIG. 7 is a block diagram of another method of making a laser system having a spatial filter according to the present disclosure.

FIG. 7 is a block diagram of another embodiment of a method of making a laser irradiation system. As shown in FIG. 7, an optical fiber comprising a core and a cladding that surrounds at least a portion of the core is provided at 700, wherein the fiber core and the cladding extend in a longitudinal direction from a first end of the optical fiber to a second end. An end cap is optically coupled (e.g., spliced) to the first end of the optical fiber at 702. For example, an end cap can be fused, spot welded, glued, or otherwise coupled to the first end of the optical fiber. In some embodiments, the end cap can be approximately the same diameter of the core, and thus the end cap can be coupled to the core of the optical fiber, substantially without contacting the cladding. An end cap length is selected so that a beam that is configured for coupling into the end cap expands significantly before reaching a cladding surface at 706. The end cap is positioned with respect to an optical flux source such as a beam formed by one or more laser beams focused (or nearly so) at an input surface of the end cap. In this configuration, the end cap can reduce the efficiency with which optical flux is coupled to the cladding. The length of the end cap can vary according to the particular application. Typically, the end cap length is greater than a clad match length that is based on a cladding diameter and a numerical aperture of the fiber or the input optical beam. For example, the end cap can extend from the first fiber end a length equal to at least $D_{clad}/2NA$, with $D_{clad}$ being the diameter of the cladding, and NA being the numerical aperture of the optical fiber.

In some embodiments, the end surface of the cladding at the first end of the optical fiber can be provided with a reflective coating and/or roughened at 704. In this way, at least some of the optical flux that is not coupled to the core through the end cap can be scattered by the cladding surface, thereby further reducing the efficiency of optical flux coupled to the cladding. A laser beam (or other optical flux) from an optical flux source (e.g., a laser diode) can then be directed towards the optical fiber at 706.

The laser beam of a laser diode or other optical flux source can be asymmetric having a higher degree of divergence in one direction than in another. For example, the beam can diverge more quickly in a direction perpendicular to the diode junction of the emitter (the fast axis of the emitter) than in a direction parallel to the diode junction (the slow axis of the emitter). As a result, the cross sections of some laser beams are elliptical. In some embodiments, an optical fiber can be positioned such that a spatial filter is located at or near a spot where the effective spot size of the beam is equal in both the fast axis and slow axis. For example, an optical fiber can be arranged within a laser system such that an exposed portion of the core or an end cap fused to an end of the optical fiber is located a position along the optical axis where the effective spot size of the fast axis is approximately equal to the effective spot size of the slow axis.

Figure 8:
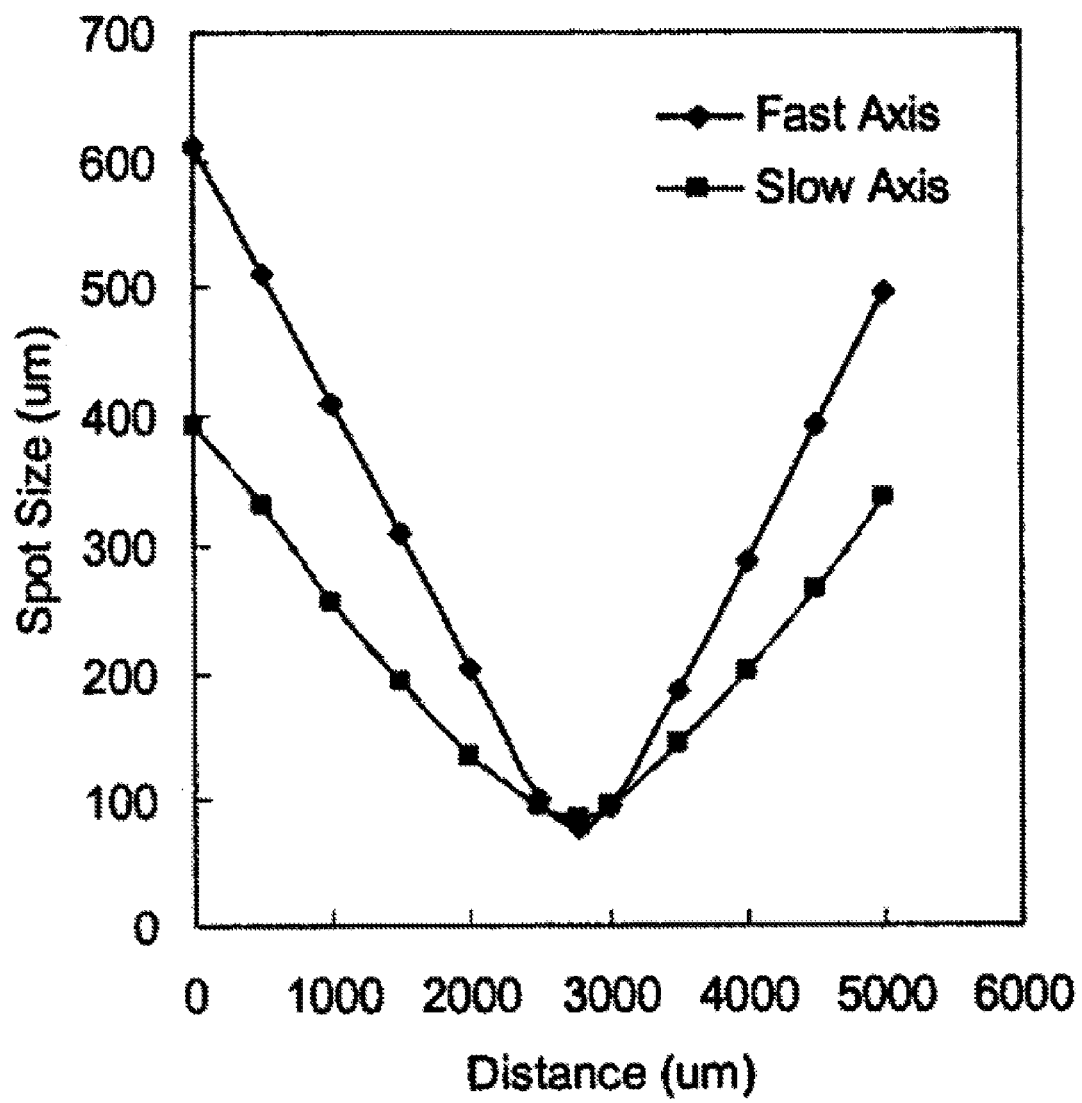
FIG. 8 is a graph plotting effective spot size as a function of position along the optical axis.

FIG. 8 is a graph plotting effective spot size with respect to so-called fast and slow axes in one example of a laser system. As shown in FIG. 8, a beam spot size at a distance of about 1.2 mm from a beam focus (a horizontal coordinate of about 2.9 mm in FIG. 8) increases from about 100 µm to about 200 µm in a slow axis direction and about 300 µm in a fast axis direction. For a fiber having a 100 µm core diameter and a 125 µm cladding diameter, such a core extension of length of about 1.2 mm can thus provide substantial reduction in beam coupling to the fiber cladding.

Figure 9:
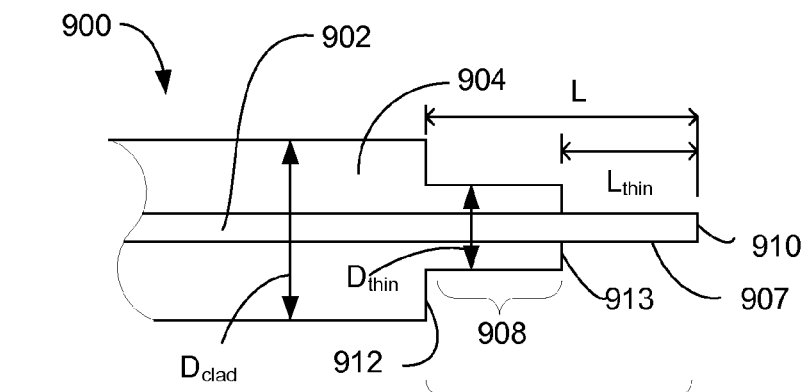
FIG. 9 is a sectional view of one embodiment of an optical fiber having a core extension defined by a core portion that includes a cladding thinned portion and a cladding stripped portion.

FIGS. 9-12 illustrate additional embodiments of optical fibers according to the present disclosure. FIG. 9 illustrates an optical fiber 900 having a core 902 surrounded by a cladding 904. The core 902 also forms a core extension 906 that has a cladding stripped portion 907 and a cladding thinned portion 908. In alternative examples, the cladding stripped portion 907 can be provided as a separate end cap that is optically coupled to the fiber core 902 in the cladding thinned portion 908. In other alternatives, the cladding thickness in the cladding thinned portion 908 is variable and can taper or otherwise vary. The core extension 906 includes an input surface 910, and cladding thickness changes abruptly or is stepped down at first and second cladding terminal surfaces 912, 913, respectively. Beam coupling to the fiber 900 can be based on one or more of the lengths of L, $L_{thin}$ of the core extension 902 and the cladding stripped portion 907, respectively, fiber core diameter, fiber cladding diameter $D_{clad}$ and thinned cladding diameter $D_{thin}$.

Figure 10:
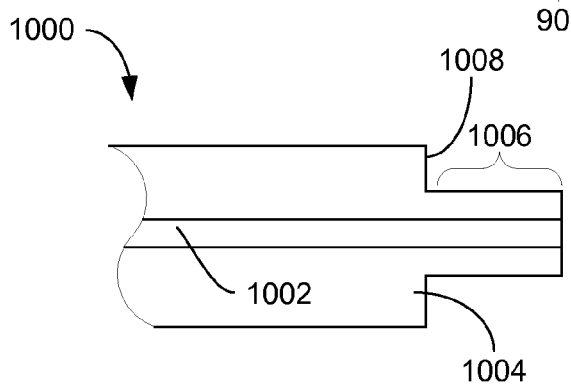
FIG. 10 is a sectional view of one embodiment of an optical fiber having a core extension that includes a thinned cladding.

FIG. 10 illustrates an optical fiber 1000 having a core 1002 surrounded by a cladding 1004, and a core extension 1006. As shown in FIG. 10, the core extension 1006 is a cladding-thinned region of the optical fiber 1000 extending outwardly from a cladding terminal surface 1008. The transition between areas of different cladding thickness can be abrupt, as shown in FIG. 10, or a gradual or tapered transition can be provided. Cladding thickness in the core extension 1006 can be less than ½, ¼, ⅕, 1/10, 1/20, 1/50, or 1/100 of the core diameter or the unthinned cladding diameter. A length of the core extension 1002 can be determined with respect to a cladding match distance as described above and an extent to which an optical flux input to the core 1002 is coupled into the cladding 1004 due to the thinned cladding in the core extension 1006.

Figure 11:
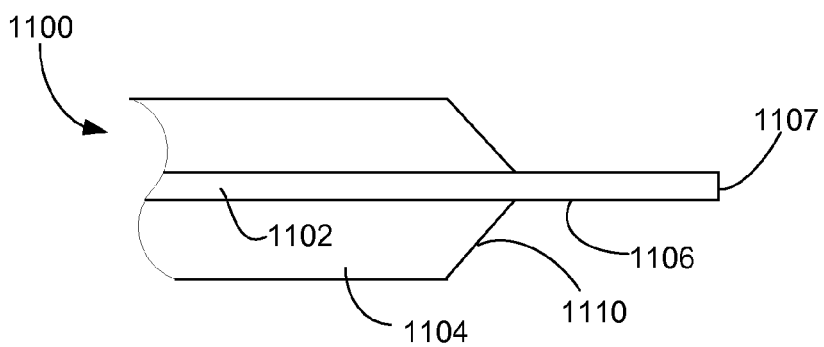
FIG. 11 is a sectional view of one embodiment of an optical fiber having a core extension defined by an exposed core portion.

FIG. 11 illustrates an optical fiber 1100 having a core 1102, a cladding 1104, and a cladding stripped core extension 1106. A cladding transition surface 1110 tapers the cladding thickness from the unthinned cladding to the cladding stripped core extension 1106. In some examples, the core extension 1106 includes at least a portion of the cladding 1105 and the cladding 1104 is not completely removed. In addition, the core extension can be provided as an end cap that is secured to the core 1102. The cladding transition surface can taper at various angles from almost 0 degrees (a gradual taper) to about 90 degrees (an abrupt taper), or can be roughed or provided with a reflective coating to reduce coupling of an optical flux received at an input surface 1107 into the cladding 1104. In some examples, additional layers such a buffer layers surrounding at least a portion of the cladding 1104, but are not shown in FIG. 11.

Figure 12:
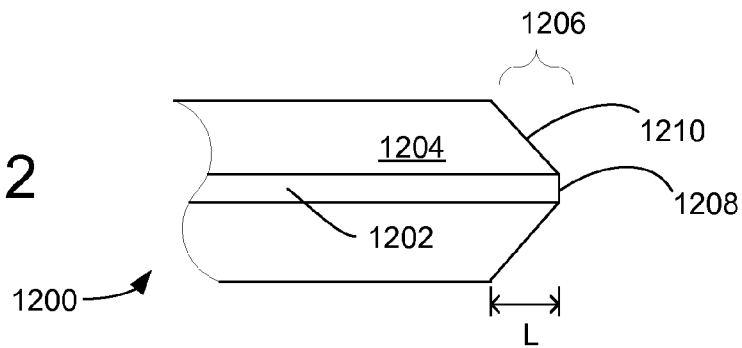
FIG. 12 is a sectional view of one embodiment of an optical fiber having a tapered cladding.

FIG. 12 shows an optical fiber 1200 having a core 1202, a cladding 1204, and a cladding tapered core extension 1206 of length L that terminates at an input surface 1208. A cladding transition surface 1210 tapers from a full cladding thickness to substantially zero thickness over the length of the core extension 1206. The surface 1210 can be reflective and/or roughened to reduce coupling of optical flux into the cladding 1204.

In view of the many possible embodiments to which the principles of the disclosed technology may be applied, it should be recognized that the illustrated embodiments are only preferred examples and should not be taken as limiting in scope. Rather, the scope of the disclosed technology is defined by the following claims. I therefore claim as my invention all that comes within the scope and spirit of these claims.

We claim:

1. An optical illumination apparatus, comprising:
   an optical radiation source configured to produce an optical beam having at least one of a beam diameter $D_{beam}$ or numerical aperture $NA_{beam}$ configured for coupling to an optical fiber;
   a section of optical fiber that includes a core and a cladding that extend to a first fiber end, the optical fiber having a core diameter $D_{core}$, a cladding diameter $D_{clad}$, and a numerical aperture $NA_{fiber}$; and
   a free space core extension optically coupled to the core at the first fiber end and extending from the first fiber end a distance of at least $D_{clad}/2NA_{fiber}$ or at least $D_{clad}/NA_{beam}$, wherein an input surface of the free space core extension is situated so as to receive the optical beam.

2. The apparatus according to claim 1, wherein the free space core extension comprises a cladding-stripped region at the first fiber end, wherein substantially all of the cladding is removed from the cladding-stripped region.

3. The apparatus according to claim 2, wherein the cladding tapers so as to define the free space core extension.

4. The apparatus according to claim 2, further comprising a cladding terminal surface at the free space core extension that is substantially perpendicular to a longitudinal axis of the optical fiber.

5. The apparatus according to claim 4, further comprising a cladding terminal surface at the free space core extension that is tilted at an angle of between about 45 degrees and 90 degrees with respect to a longitudinal axis of the optical fiber.

6. The apparatus according to claim 1, wherein the free space core extension comprises a reduced-cladding region at the first fiber end, wherein a portion of the cladding is removed along the reduced-cladding region.

7. The apparatus according to claim 6, wherein a reduced cladding thickness is less than about 1/10 of a cladding diameter $D_{clad}$.

8. The apparatus according to claim 7, wherein the reduced cladding thickness is less than about 1/20 of the cladding diameter $D_{clad}$.

9. The apparatus according to claim 1, wherein the free space core extension comprises an end cap secured to at least the core of the optical fiber, wherein the diameter of the end cap is less than the diameter of the cladding of the optical fiber at the first fiber end.

10. The apparatus according to claim 9, wherein the diameter of the end cap is substantially equal to the diameter of the core of the optical fiber at the first fiber end.

11. The apparatus according to claim 1, wherein the optical fiber is a single mode optical fiber for a wavelength λ, and the free space core extension extends from the first fiber end a distance of at least $D_{core} D_{clad}/\lambda$.

12. The apparatus according to claim 11, wherein the free space core extension extends from the first fiber end a distance of at least 2, 5, 10, or 50 times $D_{core} D_{clad}/\lambda$.

13. The apparatus according to claim 1, wherein the optical fiber is a multimode optical fiber, and the free space core extension extends from the first fiber end a distance of at least 2, 5, or 10 times $(D_{clad} - D_{core})/2NA_{fiber}$.

14. The apparatus according to claim 1, wherein the optical fiber is a multimode optical fiber, and the free space core extension extends from the first fiber end a distance of at least 2, 5, or 10 times $D_{clad}/2NA_{fiber}$.

15. The apparatus according to claim 1, wherein the core diameter is between about 8 and 500 μm, and the cladding diameter is between about 50 μm and 2 mm.

16. A system for delivering optical radiation to a target, comprising:
an optical radiation source;
a core-extended optical fiber situated to receive the optical beam at a free space core extension, wherein a length of the free space core extension is greater than a distance corresponding to a ratio of a cladding diameter of the core-extended optical fiber to the beam numerical aperture or a ratio of a cladding diameter of the core-extended optical fiber to twice a fiber numerical aperture.

17. The system of claim 16, wherein the optical radiation source includes at least one laser diode array, and the beam shaping optical system is configured to produce a combined optical beam.

18. The system of claim 17, wherein the length of the free space core-extended optical fiber is greater than 2, 5, 10, or 20 times the distance corresponding to a ratio of a cladding diameter of the core-extended optical fiber to the beam numerical aperture or a ratio of a cladding diameter of the core-extended optical fiber to twice a fiber numerical aperture.

19. The system of claim 16, wherein the free space core extension comprises a cladding-thinned portion of the optical fiber.

20. The system of claim 16, wherein the free space core extension comprises a cladding stripped portion of the optical fiber.

21. The system of claim 16, wherein the free space core extension comprises an optically transmissive end cap secured to the optical fiber, the end cap having a diameter that is less than a diameter of a cladding of the optical fiber.

22. A method, comprising:
providing an optical beam having a beam numerical aperture and a beam diameter;
directing the optical beam to an input surface of a free space core-extension on an optical fiber so as to couple the optical beam into a fiber core and so that the optical beam at an exit surface of the free space core-extension has a diameter that is greater than a fiber cladding diameter; and
directing the optical beam to a target using the optical fiber.

23. The method of claim 22, further comprising providing the optical beam so as to have a beam numerical aperture and a beam diameter corresponding to at least one of a core diameter and a numerical aperture of the optical fiber.

24. The method of claim 22, wherein a length of the free space core extension is greater than a distance corresponding to a ratio of a cladding diameter of the core-extended optical fiber to the beam numerical aperture or a ratio of a cladding diameter of the core-extended optical fiber to twice a fiber numerical aperture.

* * * * *